(12) United States Patent
Helm

(10) Patent No.: US 7,554,846 B2
(45) Date of Patent: Jun. 30, 2009

(54) SELECT GATE TRANSISTORS AND METHODS OF OPERATING THE SAME

(75) Inventor: Mark Helm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 11/823,547

(22) Filed: Jun. 28, 2007

(65) Prior Publication Data

US 2009/0003061 A1    Jan. 1, 2009

(51) Int. Cl.
*G11C 11/34*    (2006.01)
(52) U.S. Cl. .............. 365/185.05; 365/185.18; 365/185.29
(58) Field of Classification Search ........... 365/185.05, 365/185.18, 185.29, 185.28
See application file for complete search history.

(56) References Cited

U.S. PATENT DOCUMENTS

| | | | |
|---|---|---|---|
| 6,628,544 B2* | 9/2003 | Shum et al. ............ | 365/185.03 |
| 6,788,583 B2* | 9/2004 | He et al. ................ | 365/185.25 |
| 7,110,302 B2* | 9/2006 | Lee et al. ............... | 365/185.33 |

* cited by examiner

*Primary Examiner*—Son Dinh
(74) *Attorney, Agent, or Firm*—Fletcher Yoder

(57) ABSTRACT

Memory arrays, methods and cells are disclosed, such as those involving a floating gate memory array having a plurality of transistors arranged in a plurality of rows and columns, wherein each column comprises a string of the plurality of transistors coupled in series. Each such transistor includes a floating gate, a control gate, and a dielectric disposed between the floating gate and the control gate. Such a memory array also includes a plurality of select gates, wherein each select gate is coupled to each of the plurality of columns and each select gate includes a floating gate, a control gate, and an inter-gate dielectric layer. Each select gate of such a memory array also includes a switch electrically coupled between the floating gate and the control gate of the select gate and configured to switchably couple the floating gate and control gate of the select gate.

20 Claims, 5 Drawing Sheets

SELECT GATE TRANSISTORS AND METHODS OF OPERATING THE SAME

BACKGROUND

1. Field of the Invention

Embodiments of the present invention relate generally to memory devices and more specifically to charge trap memory arrays.

2. Description of the Related Art

Electronic systems, such as computers, personal organizers, cell phones, portable audio players, etc., typically include one or more memory devices to provide storage capability for the system. System memory is generally provided in the form of one or more integrated circuit chips and generally includes both random access memory (RAM) and read-only memory (ROM). System RAM is typically large and volatile and provides the system's main memory. Static RAM and Dynamic RAM are commonly employed types of random access memory. In contrast, system ROM is generally small and includes non-volatile memory for storing initialization routines and identification information. Electrically-erasable read only memory (EEPROM) is one commonly employed type of read only memory, wherein an electrical charge may be used to program data in the memory.

One type of non-volatile memory that is of particular use is a flash memory. A flash memory is a type of EEPROM that can be erased and reprogrammed in blocks. Flash memory is often employed in personal computer systems in order to store the Basic Input Output System (BIOS) program such that it can be easily updated. Flash memory is also employed in portable electronic devices, such as wireless devices, because of the size, durability, and power requirements of flash memory implementations. Various implementations of flash memory may exist, depending on the arrangement of the individual memory cells and the requirements of the system or device incorporating the flash memory.

A typical flash memory includes a memory array having a large number of memory cells arranged in rows and columns. The memory cells are generally grouped into blocks such that groups of cells can be programmed or erased simultaneously. Each of the memory cells includes a charge trap, such as a floating gate field-effect transistor capable of holding a charge. Floating gate memory cells differ from standard MOSFET designs in that they include an electrically isolated gate, referred to as the "floating gate," in addition to the standard control gate. The floating gate is generally formed over the channel and separated from the channel by a gate oxide. The control gate is formed directly above the floating gate and is separated from the floating gate by another thin oxide layer. A floating gate memory cell stores information by holding electrical charge within the floating gate. By adding or removing charge from the floating gate, the threshold voltage of the cell changes, thereby defining whether this memory cell is programmed or erased.

A NAND flash memory device is a common implementation of flash memory, so called for the logical form in which the basic memory cell configuration is arranged. Typically, the array of memory cells for NAND flash memory devices is arranged such that the control gate of each memory cell of a row of the array is connected to a wordline. Columns of the array include strings (often termed "NAND strings") of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the wordline connected to a control gate of a memory cell. In addition, the wordlines connected to the control gates of unselected memory cells of each string are driven to operate the unselected memory cells of each string as pass transistors, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines.

To erase the contents of the memory array, a relatively high voltage is applied to the memory array such that the source and drain of the memory cells to be erased are forward biased. However, those wordlines on the edge of the array ("edge wordlines") that are adjacent to select gates behave differently than those wordlines adjacent to other wordlines. The capacitance of the select gates, which are driven to a high voltage as a result of the erase operation, affects the edge wordlines, which experience a different parasitic coupling effect, such as parasitic noise, from the adjacent select gates than they would if adjacent to other wordlines. The difference in parasitic coupling or noise may result in non-uniform erase threshold voltages across the memory cells of the array. As flash memory arrays increase in size uniform erase voltages across the memory array may improve scaling and performance of the device.

Embodiments of the present invention may be directed to one or more of the problems set forth above.

DETAILED DESCRIPTION OF SPECIFIC EMBODIMENTS

Figure 1:
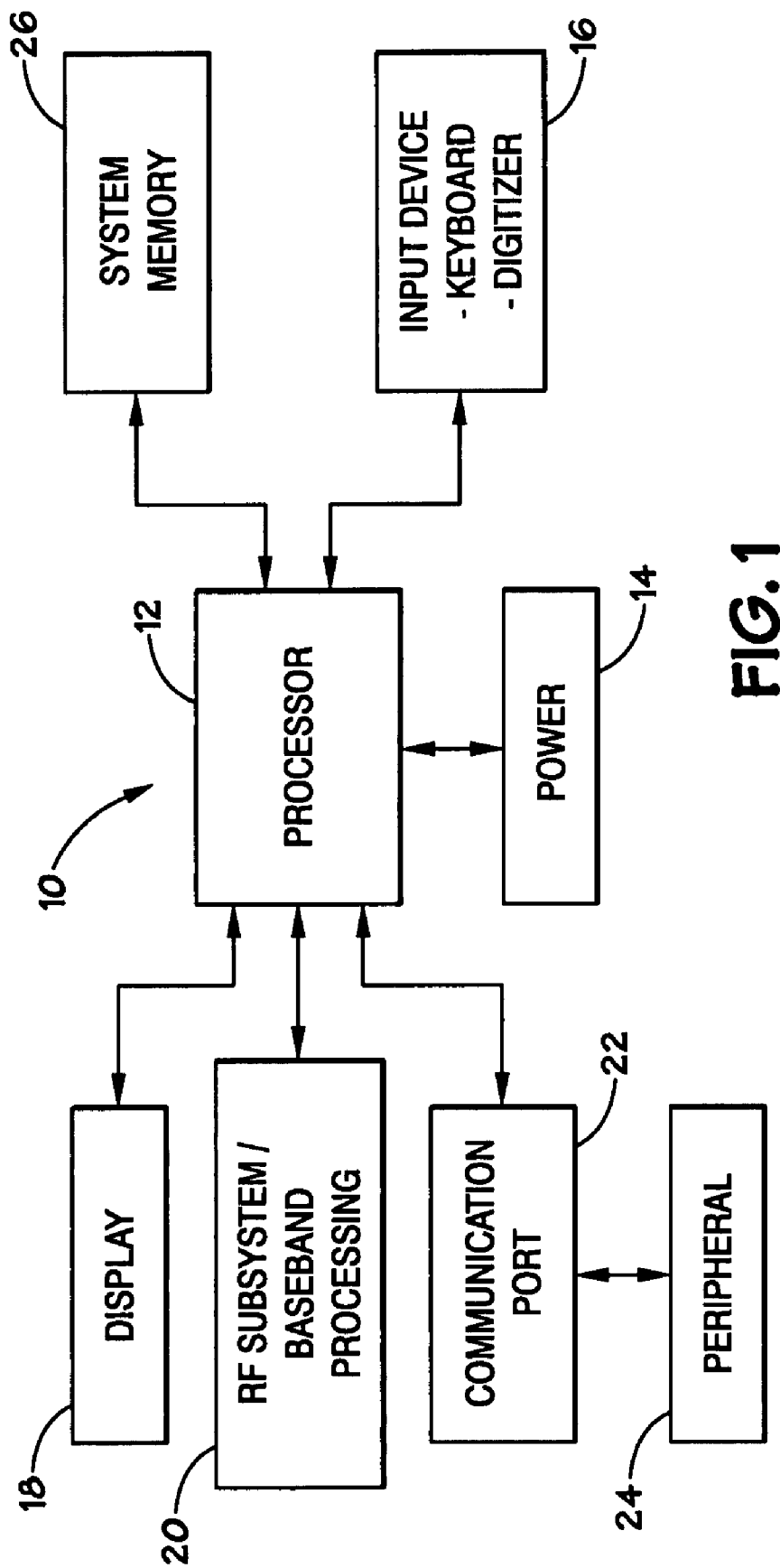
FIG. 1 illustrates a block diagram of an embodiment of a processor-based device having a memory that includes memory devices fabricated in accordance with embodiments of the present invention.

Turning now to the drawings, and referring initially to FIG. 1, a block diagram depicting an embodiment of a processor-based system, generally designated by reference numeral 10, is illustrated. The system 10 may be any of a variety of types such as a computer, pager, cellular phone, personal organizer, portable audio player, control circuit, camera, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a stylus, a mouse, and/or a voice recognition system, for instance. A display 18 may also be coupled to the processor 12. The display 18 may include an LCD, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As described further below, the system memory 26 may include one or more memory devices, such as flash memory devices, that may include a floating gate memory array fabricated in accordance with embodiments of the present invention.

Figure 2:
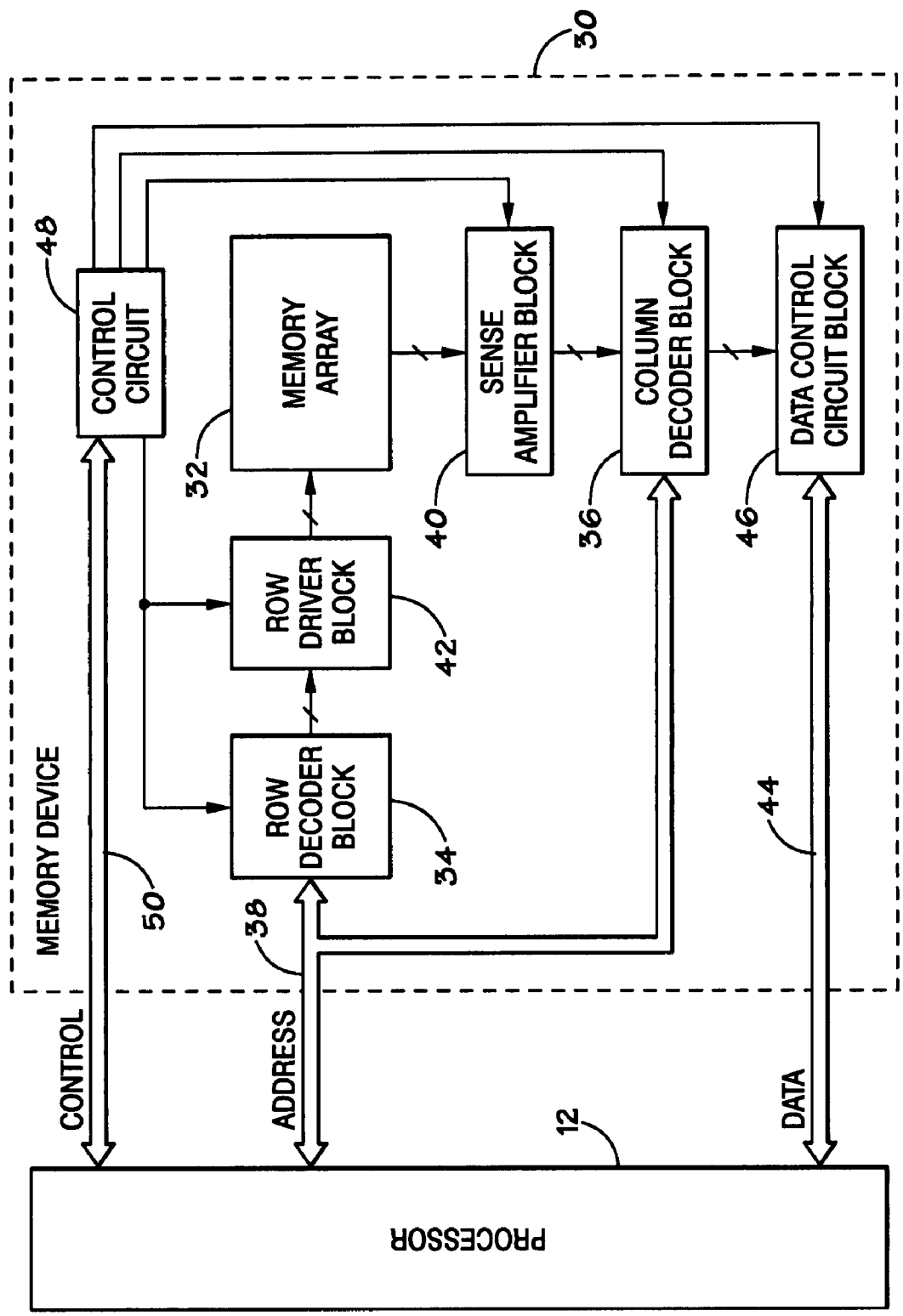
FIG. 2 illustrates a block diagram of an embodiment of a memory device having a memory array fabricated in accordance with embodiments of the present invention.

FIG. 2 is a block diagram illustrating a NAND flash memory device 30 that may be included as a portion of the system memory 26 of FIG. 1. The flash memory device 30 generally includes a memory array 32. The memory array 32 generally includes many rows and columns of conductive traces logically arranged in a grid pattern to form a number of memory cells. The lines used to select cells in the memory array 32 are usually considered the rows or "row lines," and are generally referred to as "wordlines." The lines used to access (e.g., read) the cells are usually referred to as the columns or "column lines," and are generally referred to as "bit lines" or "digit lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 to access a particular memory cell in the memory array 32. A sense amplifier block 40 having a plurality of the sense amplifiers is also provided between the column decoder 36 and the memory array 32 to sense and amplify individual values stored in the memory cells. Further, a row driver block 42 is provided between the row decoder block 34 and the memory array 32 to activate a selected word line in the memory array according to a given row address.

During read and program operations, such as a write operation, data may be transferred to and from the flash memory device 30 via the data bus 44. The coordination of the data and address information may be conducted through a data control circuit block 46. Finally, the flash memory device 30 may include a control circuit 48 configured to receive control signals from the processor 12 via the control bus 50. The control circuit 48 is coupled to each of the row decoder block 34, the column decoder block 36, the sense amplifier block 40, the row driver block 42 and the data control circuit block 46, and is generally configured to coordinate timing and control among the various circuits in the flash memory device 30.

Figure 3:
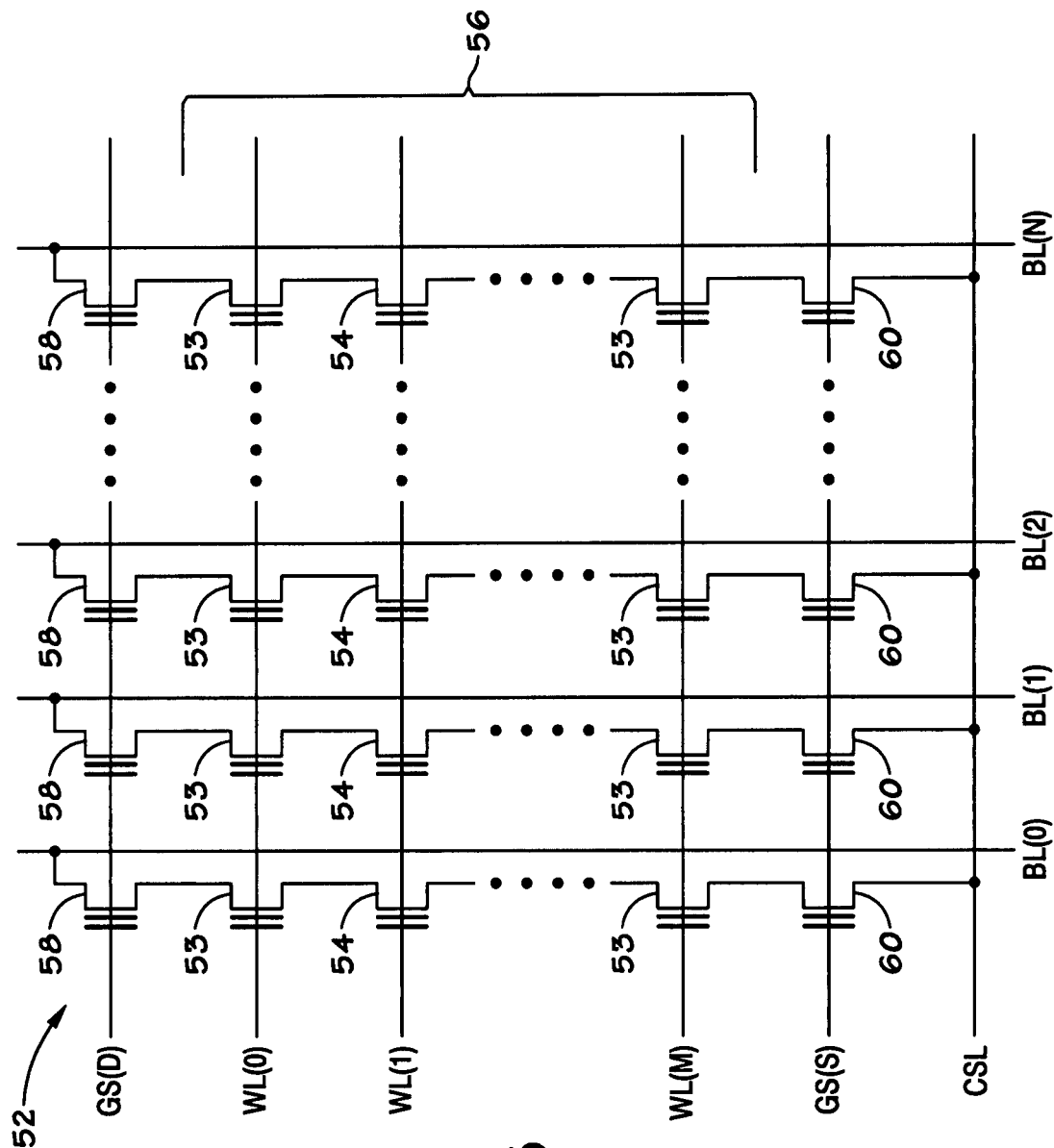
FIG. 3 is schematic diagram of the NAND flash memory array of the memory device of FIG. 2 having memory cells fabricated in accordance with embodiments of the present invention.

FIG. 3 illustrates an embodiment of the memory array 32, of FIG. 2. In this embodiment, the memory array 32 comprises a NAND memory array 52. The NAND memory array 52 includes wordlines WL(0)-WL(M) and intersecting local bit lines BL(0)-BL(N). As will be appreciated, for ease of addressing in the digital environment, the number of wordlines WL and the number of bit lines BL are each a power of two (e.g., 256 wordlines WL by 4,096 bit lines BL).

The NAND memory array 52 includes a memory cell transistor 53 or 54 located at each intersection of a wordline WL and a local bit line BL. The memory cell transistors 53 and 54 serve as non-volatile memory cells for storage of data in the NAND memory array 52, as previously described. As described further below, the memory cell transistors 53 are substantially identical to the memory cell transistors 54, except for the proximity of the memory cell transistors to the select gates 58 and 60. As will be appreciated, each memory cell transistor includes a source, a drain, a charge trap such as a floating gate, and a control gate. The control gate of each floating gate transistor 53 and 54 is coupled to a respective word line WL. The memory cell transistors 53 and 54 are connected in series, source to drain, to form a NAND string 56 formed between gate select lines. Specifically, the NAND strings 56 are formed between the drain select line GS(D) and the source select line GS(S). The memory cell transistors 53 and 54 are substantially identical, with the memory cell transistors 53 being those transistors adjacent to one of the select transistors 58 or 60 (which are sometimes referred to herein simply as "select gates"). As discussed below, however, during certain operations the behavior of the memory cell transistors 53 may differ from the memory cell transistors 54.

The drain select line GS(D) is coupled to each NAND string 56 through the respective drain select gate 58. Similarly, the source select line GS(S) is coupled to each NAND string 56 through the respective source select gate 60. The select gates 58 and the 60 each include a source, a drain, a floating gate, and a control gate, similar to the memory cell transistors. However, in order for the select gates 58 and 60 to function as direct gate connections rather than as memory cell transistors, the control gates and floating gates of the select gates can be shorted together, as described below. A column of the memory array 52 includes a NAND string 56 and the source select gate 60 and drain select gate 58 connected thereto. A row of the memory cell transistors 53 and 54 are those transistors commonly coupled to a given wordline WL.

The source of each source select gate 60 is connected to a common source line CSL, and the drain of each source select gate is coupled to the source of a floating gate transistor 53 and 54 in a respective NAND string 56. The gate of each source select gate 60 is coupled to the source select line GS(S).

The drain of each drain select gate 58 is connected to a respective local bit line BL for the corresponding NAND string 56. The source of each drain select gate 58 is connected to the drain of a floating gate transistor 53 of a respective NAND string 56. Accordingly, as illustrated in FIG. 3, each NAND sting 56 is coupled between a respective drain select gate 58 and source select gate 60. The gate of each drain select gate 58 is coupled to the drain select line GS(D).

During operation of the NAND memory array 52, the close proximity and physical construction of the array 52 may result in interference between the select gates 58 and 60 and those memory cells 53 directly adjacent to the select gates 58 and 60. For example, during an erase operation, the biasing of source select line GS(S) and drain select line GS(D) turns on the respective source select gate 60 and drain select gate 58, which are biased to a relatively high voltage levels during an erase operation (e.g. 15 V to 30 V) as compared to a read or program operation (e.g. 5V to 10 V). During such an erase operation, the difference in parasitic coupling or noise affecting the memory cell transistors 54 as compared to those memory cell transistors 53 directly adjacent to the select gates 58 and 60 may affect the erase operation. The difference in parasitic coupling or noise, and therefore different electrical performance of memory cell transistors 53 and 54, may result in non-uniform erase voltages among memory cell transistors 53 and 54.

For optimal performance during an erase operation, the floating gates of memory cell transistors 53 and 54 should be biased to the same threshold voltages and should not suffer different parasitic noise or coupling effects. Advantageously, embodiments of the present invention provide for removing the direct connection between the floating gate and control gate of the select gates 58 and 60 and allows the select gates 58 and 60 to behave like memory cell transistors during an erase operation or when such behavior is desired. If the select gates 58 and 60 behave like the memory cell transistors in the memory array, memory cell transistors 53 adjacent to select gates 58 and 60 should experience the same parasitic noise or coupling effect as memory cell transistors 54.

Figure 4:
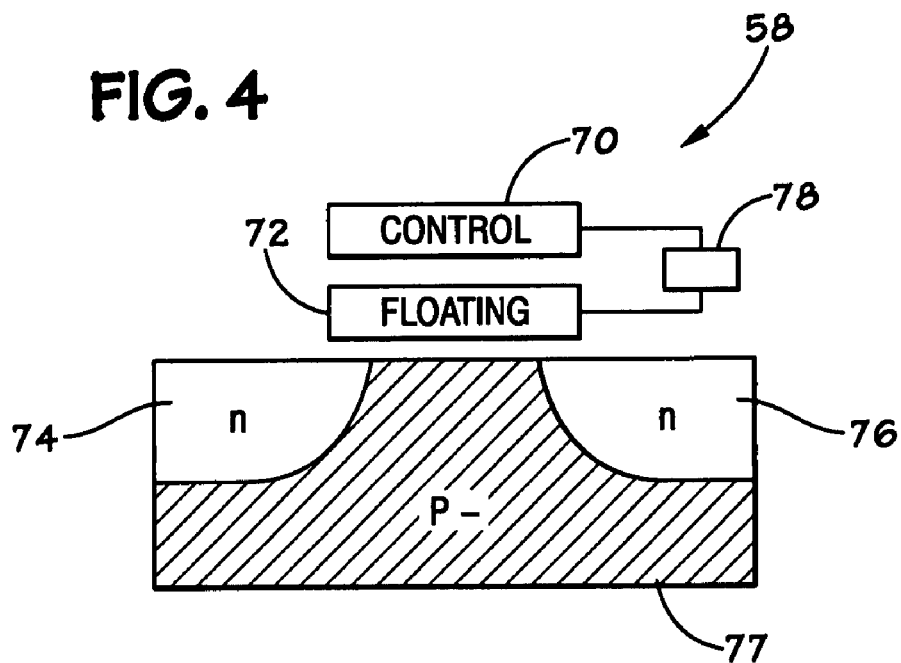
FIG. 4 illustrates a cross-sectional view of a select gate of the NAND memory array of FIG. 3 constructed in accordance with an embodiment of the present invention.

FIG. 4 illustrates a cross-sectional view of a select gate 58 in accordance with an embodiment of the present invention. As discussed above, the select gate 58 has a control gate 70 and a charge trap, such as a floating gate 72. The floating gate is formed above a source 74 and a drain 76. The floating gate "floats" above a p-well tub 77. As discussed above, the control gate 70 and floating gate 72 of the select gate 58 are electrically connected so the select gate can function as a direct gate connection during read and program operations on the memory array. In accordance with one or more embodiments of the invention, the control gate 70 and floating gate 72 are switchably coupled together by a switch 78. For example, switch 78 can electrically couple the control gate 70 and floating gate 72 or can electrically isolate the control gate 70 and floating gate 72, depending on the operation being performed. For example, during read or program operations, where the select gate functions as a direct gate connection, the switch may be turned "on" to electrically couple the control gate 70 and the floating gate 72. However, during an erase operation, the switch may be turned "off" and electrically isolate the control gate 70 and the floating gate 72. As discussed above, when the switch 78 is "off," the select gate 58 behaves like the memory cell transistors 53 and 54, i.e., with the control gate 70 electrically isolated from the floating gate 72. The switch 78 may be a transistor, a diode, two terminal switch, or any other switching device that can, for example, switchably electrically isolate or electrically connect the control gate 70 to/from the floating gate 72.

During an erase operation, the p-well tub 77 is driven to an erase voltage, for example 20V. The p-well tub 77 at 20V will forward bias the n+ source 74 and the n+ drain 76. The blocks of memory transistors selected for erase will have their corresponding wordlines grounded during the erase operation, with the control gates biased to 0V during erase. However, a conventional select gate that behaves as a direct gate connection, with a control gate electrically connected to a floating gate, will follow the p-well tub 77 bias and be driven to a high voltage. This high voltage at the select gate is believed to be responsible for the difference in parasitic coupling or noise seen by the memory cell transistors 53 adjacent to the select gates.

The select gate 58 depicted in FIG. 4 and constructed with a switch 78 should allow for reduction of this high voltage bias during erase. Turning the switch 78 to the "off" position and electrically isolating the control gate from the floating gate provides for biasing of the control gate 70 of the select gate 58 to be the same as the memory cell transistors. The control gate 70 is now isolated from the floating gate 72, and the select gate 58 does not follow the p-well tub bias during the erase operation. The edge wordlines, i.e. those wordlines connected to memory cell transistors 53 adjacent to the select gates 58 and 60, now see approximately the same adjacent gate biases as any other wordline or memory cell transistor 54 in the string, thereby they should experience approximately the same parasitic coupling or noise. The erase voltage uniformity between the edge wordlines, e.g. the floating gates of the memory cell transistors 53, and the interior wordlines, e.g. the floating gates of memory cell transistors 54, should therefore be improved as compared to edge wordlines affected by the high voltage bias of conventional select gates during an erase operation.

Figure 5:
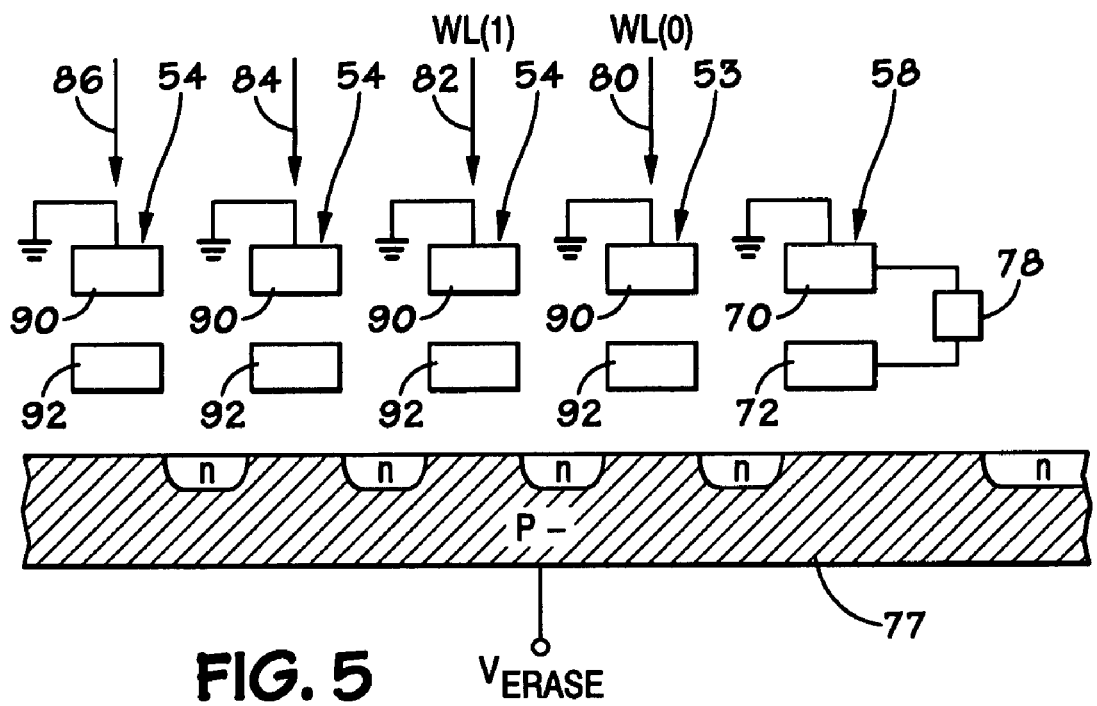
FIG. 5 illustrates a cross-sectional view of a string of the NAND memory array of FIG. 3 during an erase operation in accordance with an embodiment of the present invention.

Turning now to FIG. 5, a cross-sectional view of a string in a memory array 52 during an erase operation and with a select gate 58 fabricated in accordance with an embodiment of the present invention is shown. The wordlines 80 (WL(0)), 82 (WL(1)), 84, and 86 are shown along with the source select gate 58. The wordline 80 is an edge wordline adjacent to the select gate 58, and therefore may be differently affected by the parasitic coupling or noise difference between the memory cell transistors 53 of the wordline 80 and the select gate 58, as compared to the parasitic coupling or noise between wordines 82 and 84. Each memory cell transistor 53 and 54 has a control gate 90 and a floating gate 92, and the select gate 58 has a control gate 70 and floating gate 72. An inter-gate dielectric layer 93 is disposed between the various control gates and floating gates.

As discussed above, during an erase operation, the p-well tub 77 is driven to an erase voltage, for example 20V, while the wordlines 80-86 are pulled to ground. The control gates 90 of the memory cell transistors 53 and 54 are therefore grounded, and the control gates are biased to 0V. The source and drain of the floating gates 92 are forward biased by the p-well tub 77 voltage, and the contents of the floating gates are erased. With the switch 78 in the "off" position to electrically isolate the control gate 70 from the floating gate 72 of the select gate 58, the control gate 70 is also grounded and biased to 0V as the control gates 90 of memory cell transistors 53 and 54. The voltage bias achieved at the select gate 58 during the erase operation will then be the same as the voltage bias of the memory cell transistors 53 and 54. The edge memory cell transistors 53, i.e. edge wordline WL(0), will therefore experience the same bias as the wordlines 82, 84, and 86.

Figure 6:
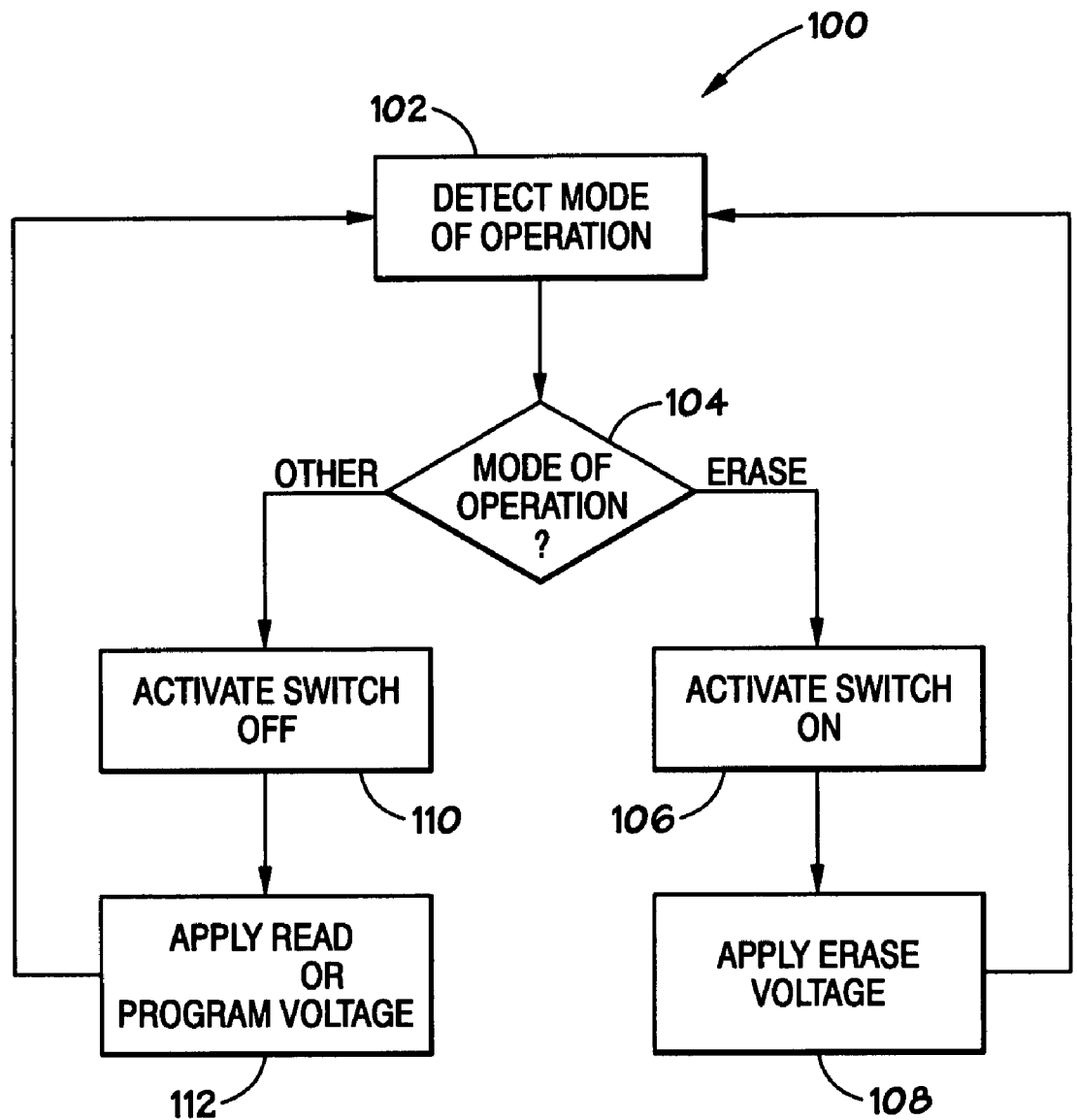
FIG. 6 is a flowchart illustrating operation of a select gate and NAND memory array in accordance with an embodiment of the present invention.

Turning now to FIG. 6, a flowchart 100 illustrating the operation of a select gate, such as select gates 58 and 60, of a NAND memory array 52 in accordance with an embodiment of the present invention. Beginning with block 102, the mode of operation of the NAND memory array is detected. The mode of operation is determined to be in one of two separate groups (decision block 104). The first mode of operation may be an erase operation, and the second mode of operation may be a read or program operation. If the mode of operation is an erase operation, the switch coupling the floating gate and control gate of a select gate is activated to "on," thereby electrically coupling the floating gate and control gate of the select gate (block 106). As discussed above, electrically coupling the floating gate and control gate of a select gate allows the select gate to behave as a floating gate memory cell transistor during the erase operation. After the switch is activated, an erase voltage is applied to the memory array 52 to erase contents of selected memory cells (block 108). As discussed above, because the select gates in those strings being erased also behave like a memory cell during application of the erase voltage, the bias and parasitic coupling or noise of those select gates are closer to that of a typical memory cell of the array, allowing greater erase uniformity across the memory cells. After the erase operation is complete, the operation of the NAND memory array 52 returns to block 102.

If the mode of operation is determined to be a read or program operation (decision block 104), the switch is activated to the "off" position, thereby electrically isolating the floating gate and control of the select gate (block 110). As discussed above, electrically isolating the floating gate and control gate allows the select gate to behave as a direct gate connection to the strings, allowing normal operation of the memory cells and strings during the read or program operation. After the switch is activated, the appropriate voltage for the read or program operation is applied to the memory array 52. After the read or program operation is complete, the operation of the NAND memory returns to block 102.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory array, comprising:
   a plurality of memory cell transistors coupled in series, wherein each of the plurality of transistors comprises:
   a charge trap;
   a control gate; and
   a dielectric disposed between the charge trap and the control gate; and
   a select transistor, coupled to a conductively-doped region of one of the transistors, wherein the select transistor comprises:
   a charge trap;
   a control gate;
   a dielectric disposed between the charge trap and the control gate; and
   a switch configured to switchably couple the charge trap and the control gate of the select transistor.

2. The memory array of claim 1, wherein the charge trap comprises a floating gate.

3. The memory array of claim 1, wherein the switch comprises a transistor.

4. The memory array of claim 1, wherein the switch comprises a diode.

5. The memory array of claim 1, wherein the switch comprises a two terminal switch.

6. The floating gate memory array of claim 1, wherein the charge traps and the control gates of each of the transistors comprises polysilicon.

7. A method, comprising:
   electrically coupling a charge trap and a control gate of a select transistor coupled in series with a memory cell transistor for a first mode of operation of the memory cell transistor; and
   electrically isolating the charge trap and the control gate of the select transistor for a second mode of operation of the memory cell transistor.

8. The method of claim 7, wherein one of electrically coupling and electrically isolating comprises activating a switch.

9. The method of claim 7, further comprising one of an erase, program, or read voltage to the memory cell transistor.

10. The method of claim 7, further comprising determining whether the memory cell transistor will be in the first mode of operation or the second mode of operation.

11. The method of claim 7, wherein the first mode of operation is an erase operation.

12. The method of claim 11, wherein the voltage is about 15 V to about 25 V.

13. The method of claim 7, wherein the second mode of operation is one of a read operation, program operation, or write operation.

14. The method of claim 13, wherein the voltage is about 5V to about 10V.

15. The method of claim 8, wherein the switch comprises one of a transistor, a diode, or a two terminal switch.

16. A cell in a memory device, comprising:
    a control gate;
    a charge trap; and
    a switch electrically coupled between the charge trap and the control gate, wherein the switch is configured to switchably couple the charge trap and the control gate.

17. The cell of claim 16, wherein the switch comprises a transistor.

18. The cell of claim 16, wherein the switch comprises a diode.

19. The cell of claim 16, wherein the switch comprises a two terminal switch.

20. The cell of claim 16, comprising a dielectric disposed between the charge trap and the control gate.

\* \* \* \* \*